United States Patent
Onódy et al.

(10) Patent No.: US 11,641,197 B2
(45) Date of Patent: May 2, 2023

(54) GATE DRIVER OUTPUT PROTECTION CIRCUIT

(71) Applicant: Skyworks Solutions, Inc., Irvine, CA (US)

(72) Inventors: Péter Onódy, Budapest (HU); Tamás Marozsák, Budapest (HU); Michael R. May, Austin, TX (US); Fernando Naim Lavalle Aviles, Austin, TX (US); Patrick De Bakker, Hollis, NH (US)

(73) Assignee: Skyworks Solutions, Inc., Irvine, CA (US)

(*) Notice: Subject to any disclaimer, the term of this patent is extended or adjusted under 35 U.S.C. 154(b) by 4 days.

(21) Appl. No.: 17/242,909

(22) Filed: Apr. 28, 2021

(65) Prior Publication Data

US 2022/0352884 A1 Nov. 3, 2022

(51) Int. Cl.
*H03K 17/082* (2006.01)
*H03K 17/284* (2006.01)
*H03K 17/14* (2006.01)
*H03K 17/08* (2006.01)

(52) U.S. Cl.
CPC ....... *H03K 17/0828* (2013.01); *H03K 17/145* (2013.01); *H03K 17/284* (2013.01); *H03K 2017/0806* (2013.01)

(58) Field of Classification Search
CPC .......... H03K 17/0828; H03K 17/145; H03K 17/284; H03K 2017/0806
See application file for complete search history.

(56) References Cited

U.S. PATENT DOCUMENTS

| | | | |
|---|---|---|---|
| 6,097,582 A | 8/2000 | John | |
| 6,271,709 B1 | 8/2001 | Kimura et al. | |
| 6,473,280 B1* | 10/2002 | Buxton | H02M 1/32 |
| | | | 361/18 |
| 6,545,513 B2 | 4/2003 | Tsuchida et al. | |
| 6,717,785 B2 | 4/2004 | Fukuda et al. | |
| 6,967,519 B2 | 11/2005 | Nakayama et al. | |
| 7,180,337 B2 | 2/2007 | Feldtkeller | |

(Continued)

FOREIGN PATENT DOCUMENTS

| | | |
|---|---|---|
| CN | 109687693 A | 4/2019 |
| JP | 2020057903 A | 4/2020 |

OTHER PUBLICATIONS

Agilent Technologies, "2.0 Amp Gate Drive Optocoupler with Integrated (VCE) Desaturation Detection and Fault Status Feedback," HCPL-316J, Mar. 1, 2005, 33 pages.

(Continued)

*Primary Examiner* — Ryan Johnson
*Assistant Examiner* — Colleen J O Toole
(74) *Attorney, Agent, or Firm* — Knobbe, Martens, Olson & Bear, LLP

(57) ABSTRACT

A method for protecting a system including a driver integrated circuit includes receiving a driver input signal. The method includes driving an output signal externally to the driver integrated circuit. The output signal is driven based on the driver input signal and an indication of a delay between receipt of an edge of the driver input signal and arrival of a corresponding edge of the output signal at an output node coupled to a terminal of the driver integrated circuit.

21 Claims, 6 Drawing Sheets

(56) References Cited

U.S. PATENT DOCUMENTS

| | | | |
|---|---|---|---|
| 7,948,277 B2* | 5/2011 | Nakatake | H03K 17/18 |
| | | | 327/109 |
| 7,978,453 B2 | 7/2011 | Sharaa | |
| 8,213,192 B2 | 7/2012 | Konecny et al. | |
| 8,237,376 B2 | 8/2012 | Franco | |
| 8,362,800 B2 | 1/2013 | Or-Bach | |
| 8,405,373 B2 | 3/2013 | Tsai et al. | |
| 8,350,601 B2 | 8/2013 | Nagata et al. | |
| 8,723,590 B2* | 5/2014 | Curbelo | H03K 17/567 |
| | | | 327/432 |
| 8,985,850 B1 | 3/2015 | Godbole et al. | |
| 9,054,621 B2 | 6/2015 | Liu | |
| 9,166,499 B2 | 10/2015 | Suzuki | |
| 9,184,743 B2 | 11/2015 | Shimizu | |
| 9,294,019 B2 | 3/2016 | Liu | |
| 9,374,028 B2 | 6/2016 | Nondahl | |
| 9,425,786 B2 | 8/2016 | Zoels et al. | |
| 9,455,566 B2 | 9/2016 | Hiyama | |
| 9,467,138 B2 | 10/2016 | Osanai | |
| 9,490,738 B2 | 11/2016 | Nondahl | |
| 9,608,623 B1 | 3/2017 | Kandah | |
| 9,698,654 B2 | 7/2017 | Santos et al. | |
| 9,793,890 B2 | 10/2017 | Kirchner et al. | |
| 9,979,292 B2 | 5/2018 | Zhang et al. | |
| 9,998,110 B2 | 6/2018 | Zojer | |
| 10,038,434 B2 | 7/2018 | Volke | |
| 10,211,824 B2 | 2/2019 | Tsurumaru | |
| 10,461,730 B1 | 10/2019 | Mariconti et al. | |
| 10,469,057 B1 | 11/2019 | Frank et al. | |
| 10,469,075 B2 | 11/2019 | Horvath | |
| 10,514,016 B1 | 12/2019 | Nodake | |
| 10,587,262 B1 | 3/2020 | Morini et al. | |
| 10,587,268 B2 | 3/2020 | Li et al. | |
| 10,608,625 B1 | 3/2020 | Bernacchia et al. | |
| 10,680,601 B1 | 6/2020 | Kempitiya | |
| 10,715,132 B2 | 6/2020 | Takayama | |
| 10,742,108 B2 | 8/2020 | Tomisawa et al. | |
| 10,763,848 B2 | 9/2020 | Takano et al. | |
| 10,778,195 B2 | 9/2020 | Gokan | |
| 10,784,857 B1 | 9/2020 | Li et al. | |
| 10,790,818 B1 | 9/2020 | Frank | |
| 10,819,212 B1 | 10/2020 | Nagano et al. | |
| 10,917,083 B2 | 2/2021 | Masuhara et al. | |
| 11,057,029 B2 | 7/2021 | Westwick et al. | |
| 2002/0109417 A1 | 8/2002 | Torrisi et al. | |
| 2004/0136135 A1 | 7/2004 | Takahashi | |
| 2004/0251951 A1 | 12/2004 | Beck | |
| 2008/0106319 A1 | 5/2008 | Bayerer | |
| 2008/0315925 A1 | 12/2008 | Alfano | |
| 2009/0021294 A1 | 1/2009 | Morishita | |
| 2010/0148830 A1 | 6/2010 | Nilson | |
| 2011/0050198 A1 | 3/2011 | Dong et al. | |
| 2011/0157919 A1 | 6/2011 | Yedevelly et al. | |
| 2011/0157941 A1 | 6/2011 | Yedevelly et al. | |
| 2012/0013370 A1 | 1/2012 | Morishita | |
| 2012/0161841 A1 | 6/2012 | Dong et al. | |
| 2012/0194218 A1 | 8/2012 | Or-Bach | |
| 2012/0218669 A1 | 8/2012 | Ioannidis et al. | |
| 2013/0088894 A1 | 4/2013 | Pal et al. | |
| 2013/0242438 A1 | 9/2013 | Fukuta | |
| 2014/0077782 A1* | 3/2014 | Cortigiani | H02M 3/156 |
| | | | 323/284 |
| 2015/0015309 A1 | 1/2015 | Werber | |
| 2015/0070078 A1 | 3/2015 | Jeong et al. | |
| 2015/0085403 A1 | 3/2015 | Santos et al. | |
| 2016/0087560 A1 | 3/2016 | Miller | |
| 2016/0218046 A1 | 7/2016 | Or-Bach | |
| 2016/0359480 A1 | 12/2016 | Kim | |
| 2018/0026629 A1 | 1/2018 | Ptacek | |
| 2018/0115310 A1 | 4/2018 | Horiguchi et al. | |
| 2018/0351546 A1 | 12/2018 | Horvath | |
| 2019/0229640 A1 | 7/2019 | Aichriedler | |
| 2019/0372567 A1 | 12/2019 | Yoshida et al. | |
| 2021/0305927 A1 | 9/2021 | Kirby et al. | |

OTHER PUBLICATIONS

Allan, R., "SiC and GaN vs. IGBTs: The Imminent Tug of War for Supremacy," Power Electronics, downloaded from powerelectronics.com, Feb. 24, 2020, 2 pages.

Analog Devices, Inc., "Isolated Half-Bridge Driver with Integrated High-Side Supply," ADuM5230, 2008-2013, 16 pages.

Analog Devices, Inc., "Isolated Half-Bridge Gate Driver with Integrated Isolated High-Side Supply," ADuM6132, 2008-2012 16 pages.

Avago Technologies, "Desaturation Fault Detection Optocoupler Gate Drive Products with Feature: ACPL-333J, ACPL-330J, ACPL-332J, ACPL-331J, and HCPL-316J," Application Note 5324, Jan. 9, 2012, 7 pages.

Avago Technologies, "Dual-Output Gate Drive Optocoupler Interface with Integrated (VCE) DESAT Detection, FAULT and UVLO Status Feedback," ACPL-339J, Jan. 31, 2013, 23 pages.

Avago Technologies, "Active Miller Clamp Products with Feature: ACPL-331J, ACPL-332J," Application Note 5314, Jul. 21, 2010, 6 pages.

Broadcom, "Data Sheet ACPL-352J 5.0 Amp Output Current IGBT and SiC/GaNMOSFET Gate Drive Optocoupler with Integrated Overcurrent Sensing, FAULT, GAIT,and UVLO Status Feedback," May 15, 2020, 29 pages.

Infineon, "EiceDRIVER™ External Booster for Driver IC," Application Note, AN2013-10, Revision 1.6, Aug. 5, 2014, 17 pages.

Infineon, "EiceDRIVER™ High Voltage Gate Driver IC with Reinforced Isolation," Final Datasheet, Revision 2.1, Oct. 22, 2018, pp. 1-33.

Obara, H., et al., "Active Gate Control in Half-Bridge Inverters Using Programmable Gate Driver ICs to Improve Both Surge Voltage and Converter Efficiency," IEEE Transactions on Industry Applications, vol. 54, No. 5, Sep./Oct. 2018, pp. 4603-4611.

Silicon Labs, "AN1009: Driving MOSFET and IGBT Switches Using the Si828x," downloaded from silabs.com on Feb. 21, 2020, 22 pages.

Silicon Labs, "Si8285/86 Data Sheet," downloaded from silabs.com on Feb. 21, 2020, 33 pages.

Texas Instruments, "Fully-Differential Isolation Amplifier," AMC1200 AMC1200B, Apr. 2011—Revised Aug. 2012, 24 pages.

Texas Instruments, "Precision Lowest-Cost Isolation Amplifier," ISO124, Sep. 1997—Revised Sep. 2005, 17 pages.

Texas Instruments, "TI Designs, IGBT Gate Driver Reference Design for Parallel IGBTs with Short-Circuit Protection and External BJT Buffer," TIDUC70A, Dec. 2016—Revised Jan. 2017, 33 pages.

Texas Instruments, "Understanding the Short Circuit Protection for Silicon Carbide MOSFETs," TI TechNotes, Jan. 2018—Revised Mar. 2019, pp. 1-4.

Vacca, G.,"Benefits and Advantages of Silicon Carbide Power Devices Over Their Silicon Counterparts," Semiconductor Today, Compounds & Advanced Silicon, vol. 12, Issue 3, Apr./May 2017, 4 pages.

Zhao, S., et al., "Adaptive Multi-Level Active Gate Drivers for SiC Power Devices," IEEE Transactions on Power Electronics, vol. 35, No. 2, Feb. 2020, 17 pages.

Schindler, A., et al., "10ns Variable Current Gate Driver with Control Loop for Optimized Gate Current Timing and Level Control for In-Transition Slope Shaping," IEEE Applied Power Electronics Conference and Exposition (APEC), Mar. 26-30, 2017, 6 pages.

* cited by examiner

124

GATE DRIVER OUTPUT PROTECTION CIRCUIT

BACKGROUND

Field of the Invention

This disclosure is related to circuits and more particularly to control circuits for high-power applications.

Description of the Related Art

A conventional gate driver integrated circuit is susceptible to error conditions that may damage the gate driver integrated circuit or a high-power drive device coupled to the gate driver integrated circuit. For example, when a short circuit condition exists or an abnormally heavy capacitive load is coupled to the gate driver integrated circuit, a relatively high current flows through the gate driver integrated circuit and may damage the gate driver integrated circuit. Measuring the die temperature of the gate driver integrated circuit using a temperature sensor is slow since heat propagates slowly through a semiconductor die. Although a temperature measurement strategy of the conventional integrated circuit gate driver provides some protection from damage due to short circuits or capacitive loads that are marginally larger than expected, if a sudden, short circuit occurs on the output of the gate driver integrated circuit, temperature sensing is too slow to react and reconfigure the gate driver integrated circuit in a safe state that would reduce the temperature and save the system from damage. Other techniques have substantial second-order effects and may be difficult to implement in a high current environment. For example, current sensing techniques may not be feasible due to difficulties in implementing an adequate current mirror in a high current environment. Accordingly, improved techniques for protecting a gate driver system from damage are desired.

SUMMARY OF EMBODIMENTS OF THE INVENTION

In at least one embodiment, a method for protecting a system including a driver integrated circuit includes receiving a driver input signal. The method includes driving an output signal externally to the driver integrated circuit. The output signal is driven based on the driver input signal and an indication of a delay between receipt of an edge of the driver input signal and arrival of a corresponding edge of the output signal at an output node coupled to a terminal of the driver integrated circuit.

In at least one embodiment, an integrated circuit for controlling a high-power drive device includes a driver circuit configured to drive an output signal to a terminal of the integrated circuit. The output signal is driven based on a driver input signal and an error signal. The integrated circuit includes a logic circuit configured to generate the error signal based on an indication of a delay between receipt of an edge of the driver input signal and arrival of a corresponding edge of the output signal at an output node coupled to the terminal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
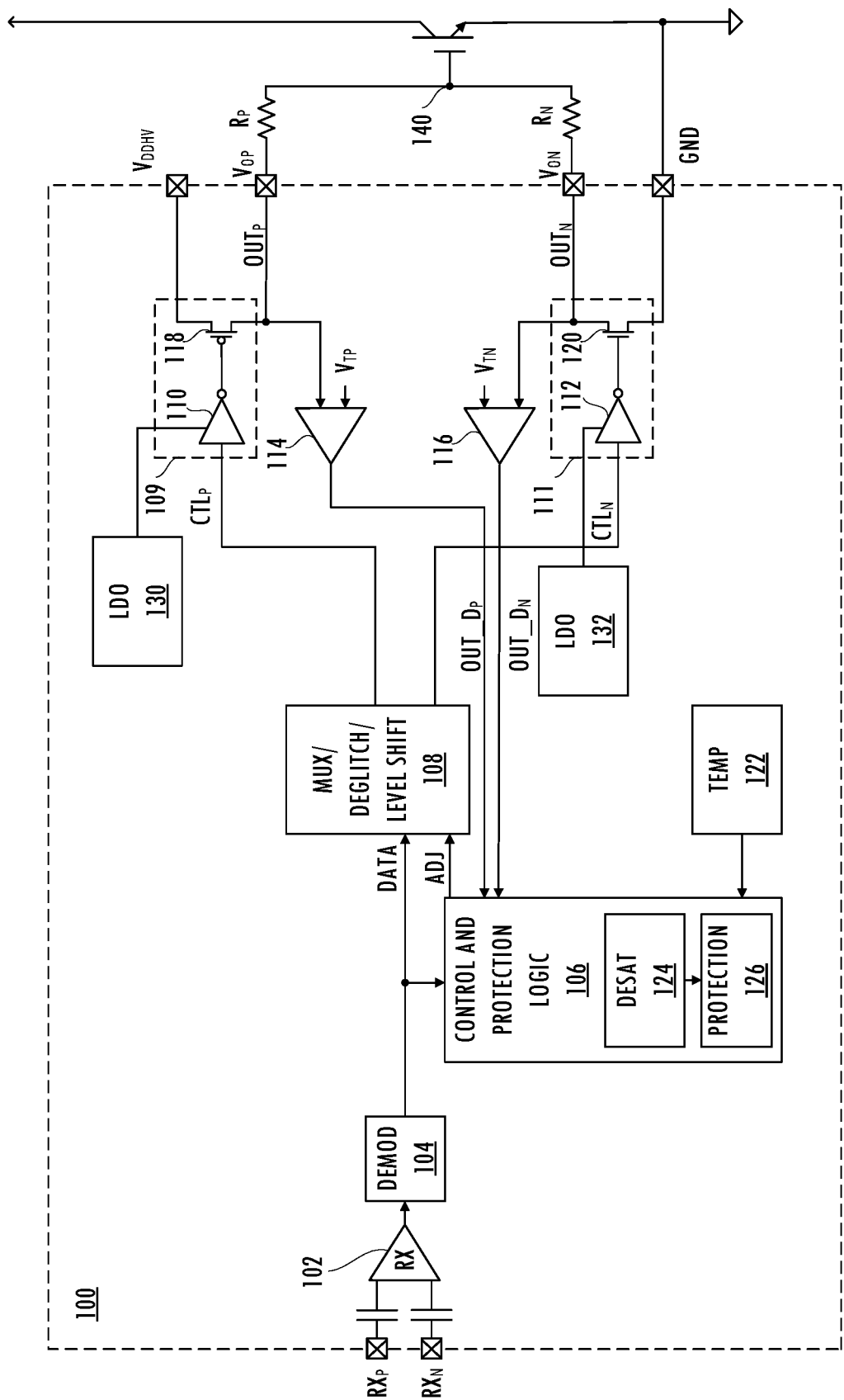
FIG. 1 illustrates a functional block diagram of an exemplary gate driver integrated circuit including a driver configured to drive a pair of output terminals consistent with at least one embodiment of the invention.

A gate driver integrated circuit with short circuit protection has improved tolerance to a short or relatively heavy capacitive load on an output terminal as compared to a conventional integrated circuit gate driver that implements short circuit protection using only a temperature measurement technique. Conventional integrated circuit gate drivers using temperature measurement techniques would fail under similar conditions and lead to catastrophic failure of the conventional integrated circuit gate driver in a target application. Referring to FIG. 1, gate driver integrated circuit 100 uses driver 109 to pull up (i.e., charge) an external node coupled to terminal $V_{OP}$ and uses driver 111 to pull down (i.e., discharge) an external node coupled to terminal $V_{ON}$. In at least one embodiment driver 109 includes pre-driver 110, which is powered by low-dropout regulator 130 and coupled to terminal $V_{OP}$ via output drive device 118. In at least one embodiment driver 111 includes pre-driver 112, which is powered by low-dropout regulator 132 and coupled to terminal $V_{ON}$ via output drive device 120.

Figure 2:
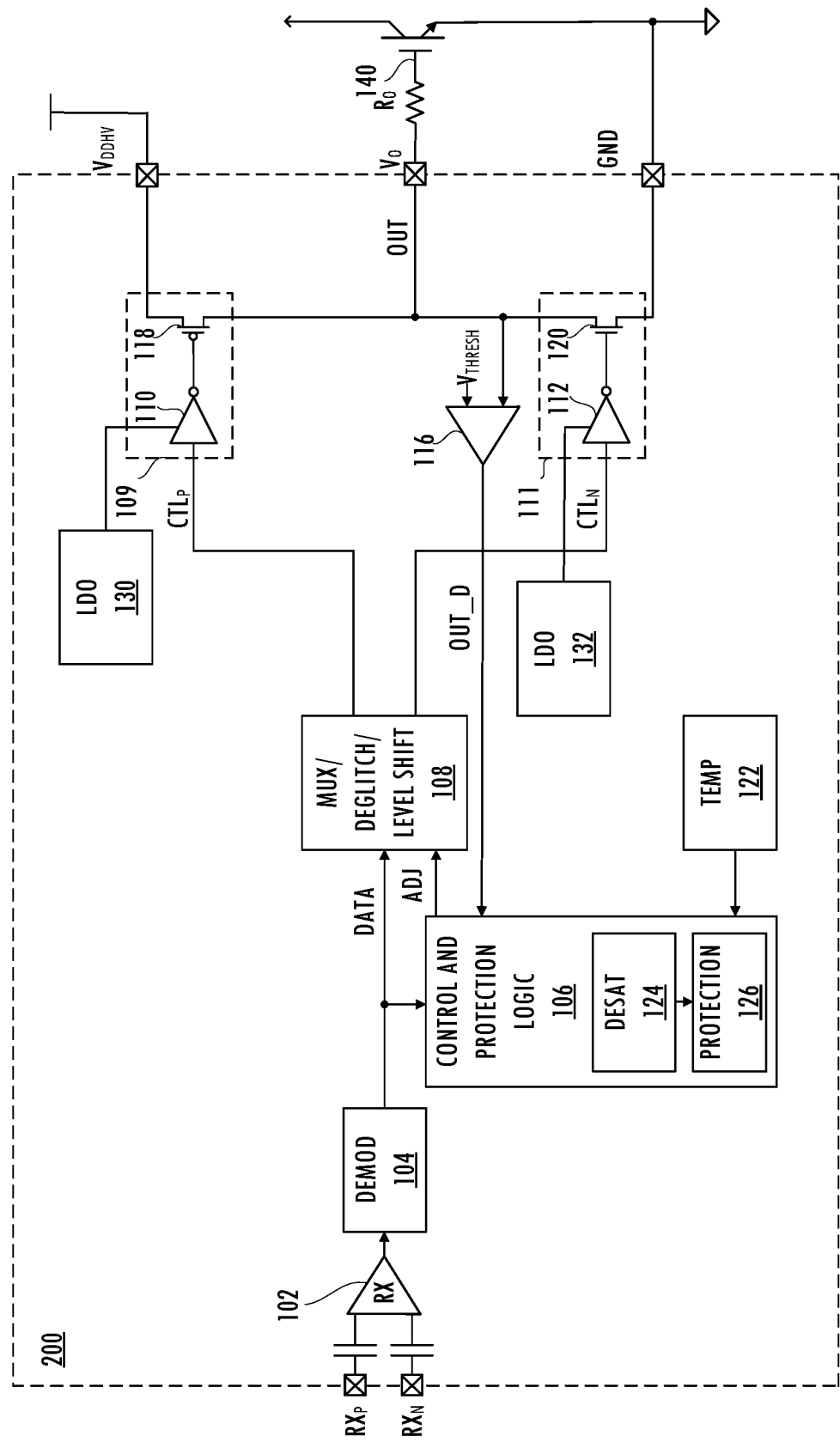
FIG. 2 illustrates a functional block diagram of an exemplary gate driver integrated circuit including a driver configured to drive a single output terminal consistent with at least one embodiment of the invention.

In at least one embodiment, gate driver integrated circuit 100 is included in an exemplary motor control application and is included in a system having an isolation barrier and an isolation communications channel for safely communicating control signals from another integrated circuit. Differential pair of terminals $RX_P$ and $RX_N$ receive an input signal from the isolation communications channel and receiver path 102 and demodulator 104 recover input signal DATA from the received signal. In at least one embodiment, gate driver integrated circuit 100 is coupled to a high-power drive device of a three-phase inverter used to deliver three-phase power to a motor. Exemplary high-power drive devices include power metal-oxide-semiconductor field-effect transistors (MOSFETs), insulated-gate bipolar transistors (IGBTs), Gallium-Nitride (GaN) MOSFETs, Silicon-Carbide power MOSFETs, or other suitable devices able to deliver high currents over short periods of time. FIG. 2 illustrates an alternate embodiment of a gate driver integrated circuit. Gate driver integrated circuit 200 uses output drive device 118 and output drive device 120 coupled to terminal Vo to selectively pull up or pull down an external node.

Referring to FIG. 1, in at least one embodiment, gate driver integrated circuit 100 includes short circuit protection that is responsive to signals on output terminal $V_{OP}$ and output terminal $V_{ON}$. An exemplary short circuit protection circuit measures a time difference between an edge of input signal DATA received from demodulator 104 and a corresponding edge of output signal $OUT_P$ or output signal $OUT_N$ that is driven to terminal $V_{OP}$ or terminal $V_{ON}$, respectively. If the time difference indicates that the output edge is delayed more than expected (i.e., more than a predetermined delay), then the time difference indicates that a relatively high current is flowing through gate driver integrated circuit 100, which can result in a dangerous amount of power dissipation and damage the system. Thus, the delay is used as a proxy for a measure of a short circuit current through an output terminal coupled to a control node of the high-current drive device.

If the time difference between an edge of input signal DATA and a corresponding output edge exceeds the predetermined threshold value, then a logic circuit that implements a digital state machine configures gate driver integrated circuit 100 in a safer state of operation (i.e., a state that is safer than a normal state of operation, e.g., configures gate driver integrated circuit 100 to strongly pull down the external node or weakly pull down the external node according to whether gate driver integrated circuit 100 is pulling up or pulling down in a normal state of operation). After gate driver integrated circuit 100 is configured in the safer state of operation, the logic circuit periodically attempts to return gate driver integrated circuit 100 to the normal state of operation. If the delay of gate driver integrated circuit 100 is within a target range, then gate driver integrated circuit 100 continues or resumes normal operation. If gate driver integrated circuit 100 continues to have relatively large delays, then the logic circuit maintains gate driver integrated circuit 100 in a safer state of operation and periodically attempts to resume normal operation.

In at least one embodiment of gate driver integrated circuit 100, rather than, or in addition to, comparing the delay to a threshold level for each signal transition, gate driver integrated circuit 100 estimates a long-term average of transition delays. If the estimate of the long-term average of transition delays exceeds a predetermined long-term average delay threshold, then the logic circuit causes gate driver integrated circuit 100 to enter a safer state, like the strategy discussed above. Accordingly, gate driver integrated circuit 100 can detect a short circuit condition and cause gate driver integrated circuit 100 to enter a safer state relatively quickly even in an environment where input signal DATA has many transitions.

Figure 3:
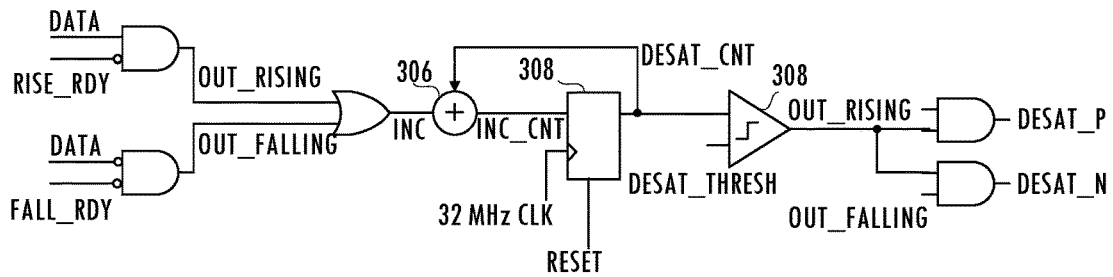
FIG. 3 illustrates a functional block diagram of an exemplary logic circuit configured to generate an error signal using a counter consistent with at least one embodiment of the invention.
Figure 4:
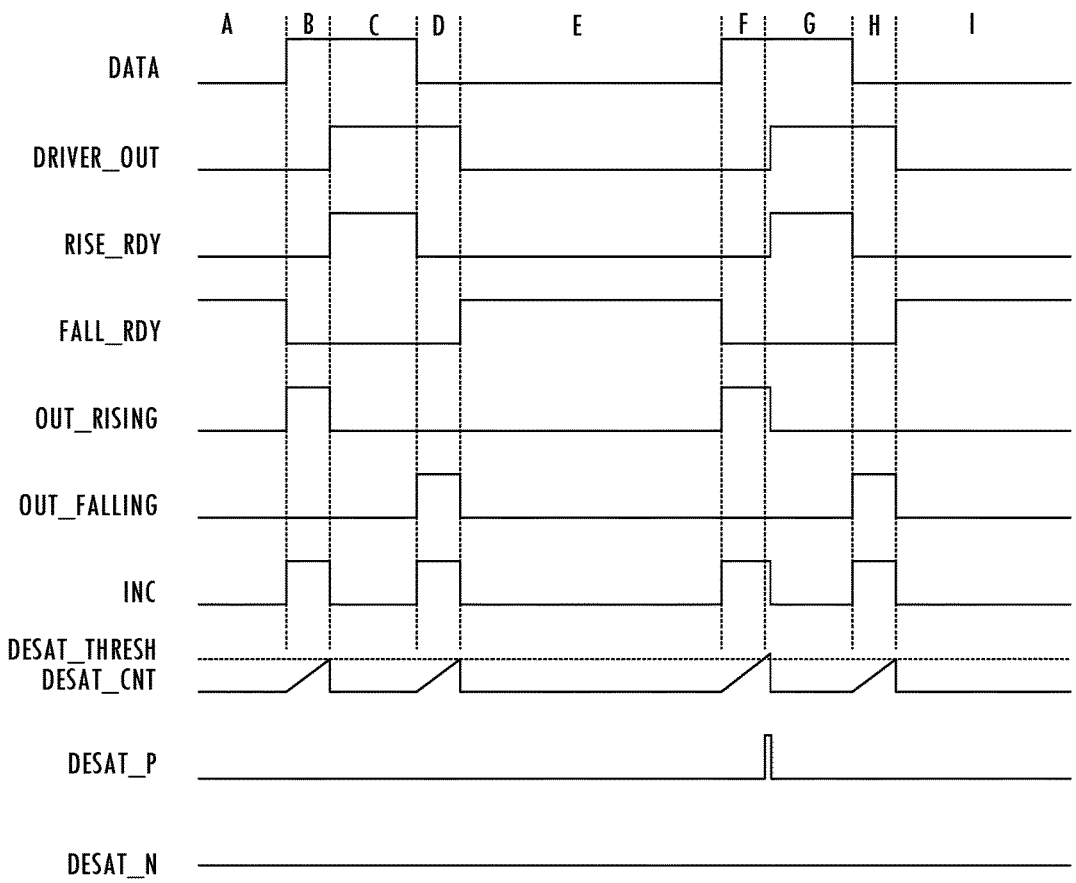
FIG. 4 illustrates exemplary waveforms for the logic circuit of FIG. 3 consistent with at least one embodiment of the invention.

Referring to FIGS. 1, 3, and 4, in at least one embodiment of gate driver integrated circuit 100, comparator 114 and comparator 116 compare output signal $OUT_P$ and output signal $OUT_N$, respectively, to threshold voltage $V_{TP}$ and threshold voltage $V_{TN}$, respectively, to generate digital signal $OUT\_D_P$ and digital signal $OUT\_D_N$, respectively. Digital signal $OUT\_D_P$ and digital signal $OUT\_D_N$ are digital representations of the level of output signal $OUT_P$ and output signal $OUT_N$, respectively. Control and protection logic 106 uses digital signal $OUT\_D_P$ and digital signal $OUT\_D_N$ to identify a short circuit condition based on the signal delay. In at least one embodiment, desaturation logic 124 generates logic signal RISE_RDY and logic signal FALL_RDY, which are asserted after completion of a rising edge or a falling edge of a driver output signal corresponding to a rising edge or failing edge, respectively, of input signal DATA thereby indicating that the most recent transition of input signal DATA, has been completed by output signal $OUT_P$ or output signal $OUT_N$, respectively.

In at least one embodiment, desaturation logic 124 logically combines digital signal RISE_RDY and digital signal FALL_RDY, with input signal DATA (or a signal corresponding to the logic value of input signal DATA) to generate logic signal OUT_RISING and logic signal OUT_FALLING, respectively. Logic signal OUT_RISING and logic signal OUT_FALLING are indicative of whether a corresponding rising edge or falling edge of input signal DATA is delayed at the output. Desaturation logic 124 generates signal INC, which is a digital signal that is active when a corresponding rising edge or falling edge of input signal DATA is delayed at the output, and is inactive otherwise. In at least one embodiment, desaturation logic 124 includes a counter that increments in response to signal INC being active and stores a corresponding count in register 308 synchronously to an edge of a clock control signal (e.g., a 32 MHz clock signal).

In at least one embodiment of desaturation logic 124, comparator 310 determines whether the count exceeds predetermined threshold count DESAT_THRESH and generates one or more error signal based thereon. In at least one embodiment, the error signal(s) indicate whether a delay that exceeds the threshold occurs in response to a rising edge of input signal DATA or a falling edge of input signal DATA. For example, if a delay that exceeds the threshold occurs in response to a rising edge, then desaturation logic 124 pulses error signal DESAT_P and if the delay that exceeds the threshold occurs in response to a falling edge, then desaturation logic 124 pulses error signal DESAT_N.

Input signal DATA rises from logic '0' in interval A to logic '1' in interval B while DRIVER OUT remains at logic '0.' In interval B, input signal DATA and signal DRIVER_OUT are unequal, signal OUT_RISING is active and desaturation logic 124 increments the count (e.g., INC is active) to cause DESAT_CNT to increase linearly. In interval C, input signal DATA and signal DRIVER_OUT are equal, signal OUT_RISING is inactive, and register 308 is reset to clear DESAT_CNT. In interval D, input signal DATA and signal DRIVER_OUT are unequal, signal OUT_FALLING is active and desaturation logic 124 increments the count (e.g., INC is active) to cause DESAT_CNT to increase linearly. In interval E, input signal DATA and signal DRIVER_OUT are equal, signal OUT_FALLING is inactive, and register 308 is reset to clear DESAT_CNT.

Input signal DATA rises from logic '0' in interval E to logic '1' in interval F while DRIVER OUT remains at logic '0.' In interval F, input signal DATA and signal DRIVER_OUT are unequal, signal OUT_RISING is active and desaturation logic 124 increments the count (e.g., INC is active) to cause DESAT_CNT to increase linearly. In interval F, in response to DESAT_CNT crossing threshold value DESAT_THRESH, desaturation pulses error signal DESAT_P. FIGS. 3 and 4 are exemplary only and other logic generates one or more error signal based on the delay between and edge of input signal DATA and a corresponding edge of a driver output signal.

Figure 5:
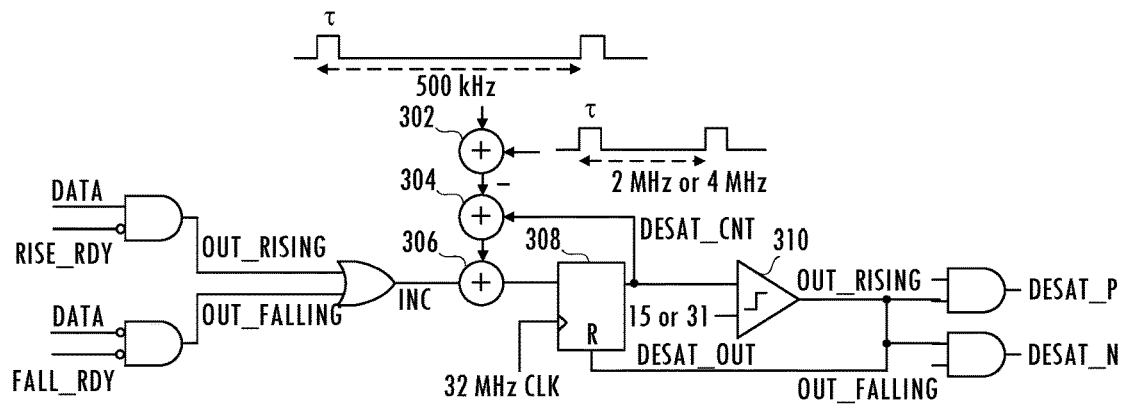
FIG. 5 illustrates a functional block diagram of an exemplary logic circuit configured to generate an error signal using a counter to generate an estimate of a long-term average delay consistent with at least one embodiment of the invention.
Figure 6:
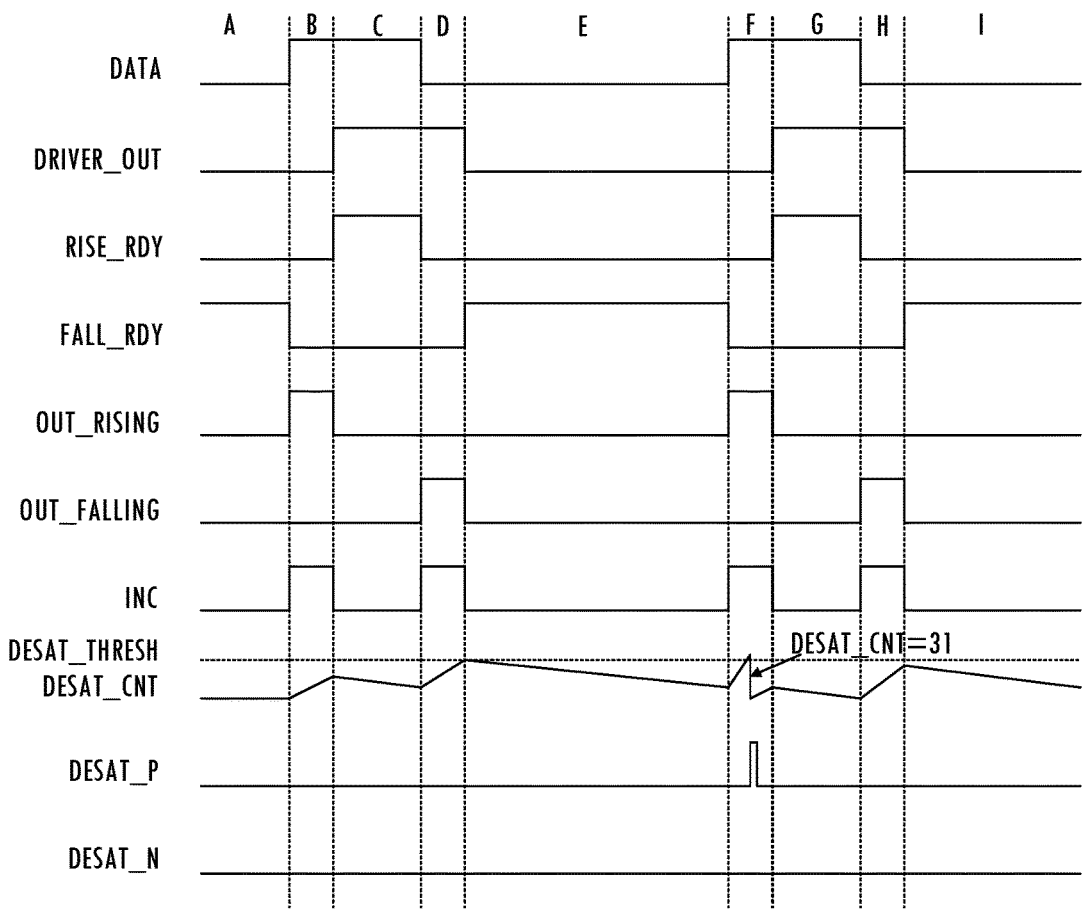
FIG. 6 illustrates exemplary waveforms for the logic circuit of FIG. 5 consistent with at least one embodiment of the invention.

In at least one embodiment, control and protection logic 106 includes desaturation logic 124 that estimates a long-term average of transition delays over a predetermined interval. Referring to FIGS. 1, 5, and 6, in at least one embodiment, desaturation logic 124 uses a counter to estimate the long-term average of transition times. Desaturation logic 124 uses a DC offset to estimate an average transition time (e.g., transition time as a percentage of the period of input signal DATA) and identifies a short circuit condition based on that estimate. In at least one embodiment, desaturation logic 124 generates logic signal RISE_RDY and logic signal FALL_RDY, which are asserted in response to completion of a rising edge or a falling edge of output signal $OUT_P$ or output signal $OUT_N$, respectively, thereby indicating that the most recent transition of input signal DATA has been completed by output signal $OUT_P$ or output signal $OUT_N$, respectively.

Desaturation logic 124 logically combines digital signal RISE_RDY and digital signal FALL_RDY, with input signal DATA (or a signal corresponding to the logic value of input signal DATA) to generate logic signal OUT_RISING and logic signal OUT_FALLING, respectively. Logic signal OUT_RISING and logic signal OUT_FALLING indicate whether a corresponding rising edge or falling edge of input signal DATA is delayed at the output (e.g., logic level corresponding to digital signal $OUT\_D_P$ and the logic level corresponding to input signal DATA are unequal). Desaturation logic 124 uses logic signal OUT_RISING and logic signal OUT_FALLING to generate control signal INC, which is active when the logic value of the input signal DATA is not equal to a logic value corresponding to the output signal (e.g., a logic value corresponding to digital signal $OUT\_D_P$ or a logic value corresponding to digital signal $OUT\_D_N$) and is inactive otherwise. Desaturation logic 124 includes register 308 (e.g., a five-bit register) that updates a stored counter value in response to increment count signal INC_CNT synchronously to a clock control signal (e.g., a 32 MHz clock signal). The counter output signal DESAT_CNT is fed back to summing circuit 304. Summing circuit 304 subtracts a DC offset (e.g., generated by summing circuit 304 combining a 2 MHz period waveform and a 500 kHz period waveform or a 4 MHz and period waveform and 500 kHz period waveform) from a current value of counter output signal DESAT_CNT and increments that difference as needed before updating register 308. Thus, desaturation logic 124 increments the count at a first predetermined rate and decrements the count at a second predetermined rate, effectively subtracting a fraction of a least-significant bit of the counter every clock period (e.g., for an effective 2.5 counts per 1 μs when summing circuit 304 combines the 2 MHz period waveform with the 500 kHz period waveform or for an effective 4.5 counts per 1 μs when summing circuit 304 combines the 4 MHz period waveform with the 500 kHz period waveform). In at least one embodiment, the first predetermined rate is greater than the second predetermined rate. Other embodiments of desaturation logic 124 use different digital circuit implementations to generate counter output signal DESAT_CNT or implementations of other computations that estimate the long-term average of the delay.

Input signal DATA rises from logic '0' in interval A to logic '1' in interval B while DRIVER_OUT remains at logic '0.' In interval B, input signal DATA and signal DRIVER_OUT are unequal, signal OUT_RISING is active and desaturation logic 124 increments the count (e.g., INC is active) by a first predetermined offset value to cause DESAT_CNT to increase linearly at a first rate. In interval C, input signal DATA and signal DRIVER_OUT are equal, signal OUT_RISING is inactive, and desaturation logic 124 decrements the count (e.g., INC is inactive) by a second predetermined offset value to cause DESAT_CNT to decrease linearly at a second rate that is slower than the first rate. Input signal DATA falls from logic '1' in interval C to logic '0' in interval D while DRIVER OUT remains at logic '1.' In interval D, input signal DATA and signal DRIVER_OUT are unequal, signal OUT_FALLING is active and desaturation logic 124 increments the count (e.g., INC is active) by the first predetermined offset value to cause DESAT_CNT to increase linearly at the first rate. In interval E, input signal DATA and signal DRIVER_OUT are equal, signal OUT_FALLING is inactive, and desaturation logic 124 decrements the count (e.g., INC is inactive) by the second predetermined offset value to cause DESAT_CNT to decrease linearly at the second rate.

Input signal DATA rises from logic '0' in interval E to logic '1' in interval F while DRIVER OUT remains at logic '0.' In interval F, input signal DATA and signal DRIVER_OUT are unequal, signal OUT_RISING is active and desaturation logic 124 increments the count (e.g., INC is active) by the first predetermined offset value to cause DESAT_CNT to increase linearly. In interval F, in response to DESAT_CNT exceeds threshold value THRESH, and desaturation logic 124 causes the signal DESAT_OUT to reset register 308 and pulses error signal DESAT_P. FIGS. 5 and 6 are exemplary only and other logic generates one or more error signals based on an indication of a delay between receipt of an edge of the driver input signal and arrival of a corresponding edge of the output signal at an output node coupled to the terminal. In other embodiments, desaturation logic 124 combines the logic and delay counter of FIG. 3 with the logic and estimate of the long-term average count of FIG. 5 or additional indicators of other conditions to generate error signal DESAT_P or DESAT_N.

Figure 7:
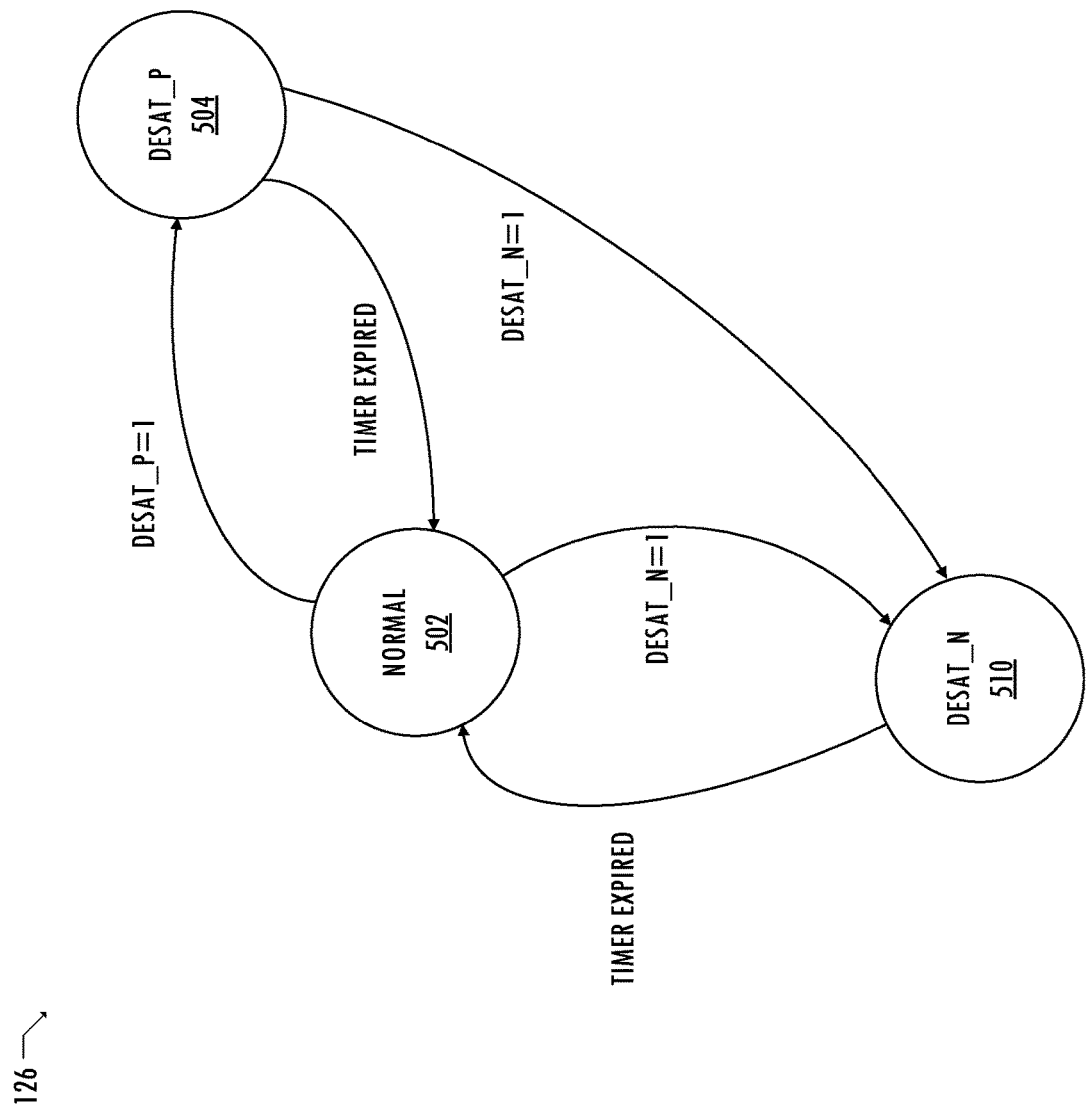
FIG. 7 illustrates an exemplary state diagram for configuration of a gate driver integrated circuit implementing short circuit protection and including delay-based control consistent with at least one embodiment of the invention.

Referring to FIGS. 1, 2, and 7, in at least one embodiment of control and protection logic 106, desaturation logic 124 provides an error indication (e.g., error signal DESAT_P or error signal DESAT_N) to protection logic 126, which includes a logic circuit that generates control signal ADJ based on the error indication. In at least one embodiment, multiplexer/deglitch/level shifter 108 uses control signal ADJ to generate control signal $CTL_P$ and control signal $CTL_N$ that configure gate driver integrated circuit 100 in a safer state. In some applications (e.g., motor control applications), node being driven (e.g., node 140) is a control node of a high-power drive device and must be either turned on or turned off for safe operation, and a high-impedance state of the node is not a safe state of the system. Rather, control signal ADJ causes multiplexer/deglitch/level shifter 108 to generate control signal $CTL_P$ and control signal $CTL_N$ to transition between states that pull up or pull down the external node (i.e., states that charge the external node or discharge the external node) and states that pull down the external node (i.e., states that discharge the external node) with a normal strength, a weak strength (i.e., weaker than normal strength), or a strong strength (i.e., stronger than normal strength). For example, if gate driver integrated circuit 100 drives the external node high for too long in a normal state, then protection logic 126 transitions to a strong pull-down configuration to reduce the amount of heat being generated in the normal state. If gate driver integrated circuit 100 drives the external node low for too long in a normal state or a safer state, then protection logic 126 transitions to a weak pull-down configuration because pulling down in the normal state or safer state generates too much heat.

In an exemplary embodiment of gate driver integrated circuit 100, protection logic 126 configures gate driver integrated circuit 100 to operate in normal state 502 in the absence of an error condition. Protection logic 126 determines whether an error has occurred by monitoring error signal DESAT_P and error signal DESAT_N, discussed above. If no error has occurred, then protection logic 126 and gate driver integrated circuit 100 continue operation in normal state 502. If error signal DESAT_N is active (e.g., DESAT_N='1'), indicating that the output has been transitioning low for an interval longer than a predetermined interval (e.g., greater than 8% of the time over an interval of 10 µs or for an interval greater than or equal to 1 µs), then protection logic 126 configures gate driver integrated circuit 100 in DESAT_N state 510. If error signal DESAT_P is active (e.g., DESAT_P='1'), indicating that the output has been transitioning high for an interval longer than a predetermined interval (e.g., greater than 8% of the time over an interval of 10 µs or for an interval greater than or equal to 1 µs), then protection logic 126 configures gate driver integrated circuit 100 in DESAT_P state 504.

In DESAT_P state 504, gate driver integrated circuit 100 starts a timer and strongly drives the output low (e.g., having a strength that is equal to or greater than the strength used when driving the output low in normal state 502). Upon the expiration of a predetermined interval (e.g., 1 ms) while in DESAT_P state 504, if error signal DESAT_N is active, then protection logic 126 configures gate driver integrated circuit 100 in DESAT_N state 510. Upon the expiration of the predetermined interval while in DESAT_P state 504, protection logic 126 returns to normal state 502. In DESAT_N state 510, gate driver integrated circuit 100 starts the timer and weakly drives the output low (e.g., having a strength that is less than the strength used to drive the output low during normal state 502). In at least one embodiment, when weakly driving the output low, the current output of gate driver integrated circuit 100 is low enough that gate driver integrated circuit 100 can survive in this condition for a long time (e.g., the product lifetime). For example, gate driver integrated circuit 100 drives only a few milli-Amps of current into the output in a worst-case thermal environment. In response to expiration of a predetermined interval (e.g., 1 ms), protection logic 126 configures gate driver integrated circuit 100 to return to normal state 502.

In at least one embodiment, in addition to monitoring a delay between the input signal DATA and an output signal, if gate driver integrated circuit 100 has a die temperature that exceeds a threshold, then protection logic 126 transitions to a strong pull-down configuration to prevent an external device from being damaged. In at least one embodiment, if gate driver integrated circuit 100 has a die temperature that exceeds a threshold for an extended period of time or exceeds the threshold in combination with an excessive delay, then protection logic 126 transitions to a weak pull-down configuration since the strong pulldown state has not eliminated an overtemperature condition.

Figure 8:
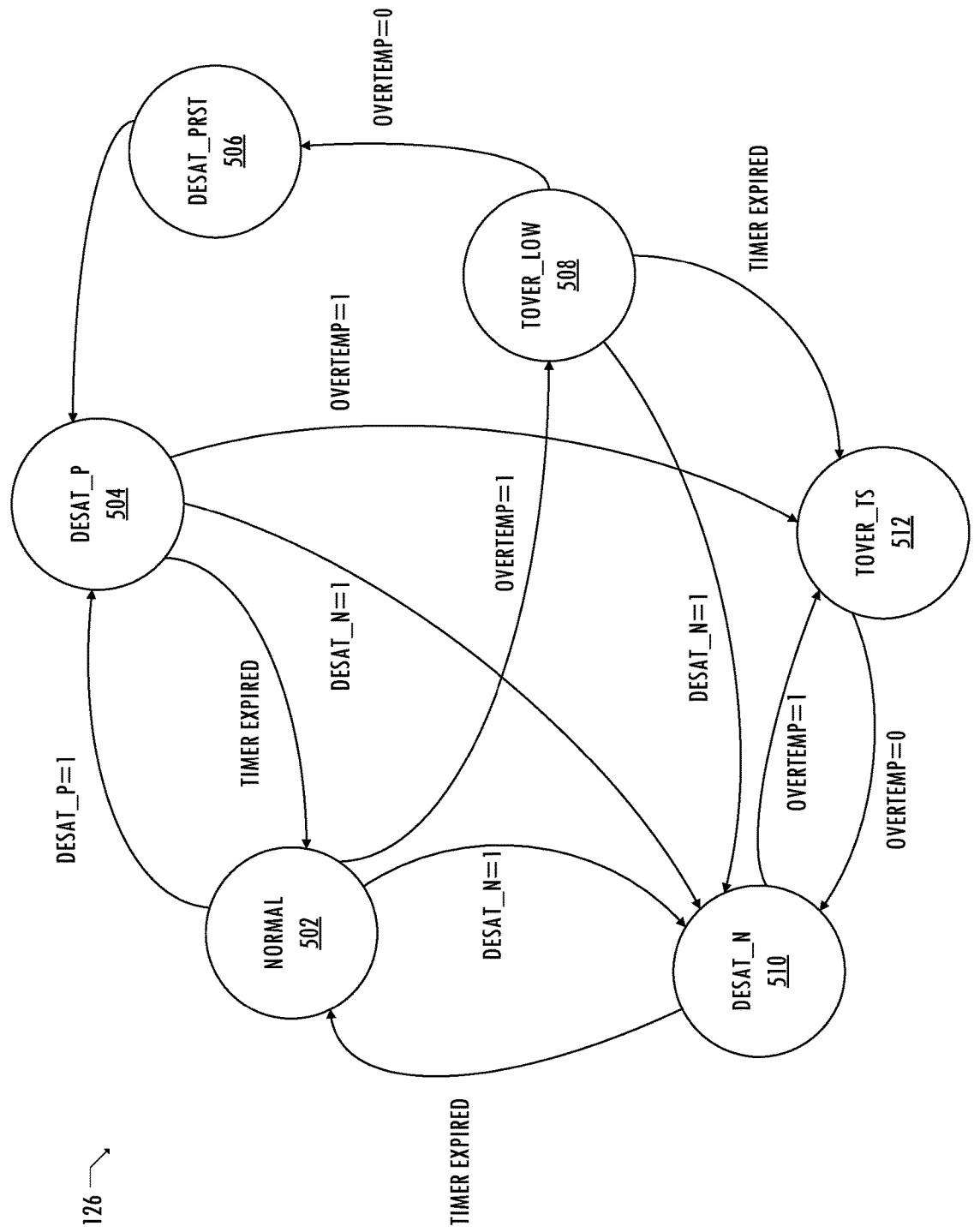
FIG. 8 illustrates an exemplary state diagram for configuration of a gate driver integrated circuit implementing short circuit protection and including delay-based control and temperature-based control consistent with at least one embodiment of the invention.

In at least one embodiment of protection logic 126, in addition to error signals DESAT_N and DESAT_P, protection logic 126 also receives an indication of a sensed die temperature or other sensed information and detects errors based on the sensed die temperature or other sensed information. For example, temperature sensor 122 provides a sensed temperature to protection circuit 126, which generates error signal OVERTEMP based on a comparison of the sensed temperature to a threshold temperature. Error signal OVERTEMP is set (e.g., OVERTEMP='1') in response to the sensed temperature exceeding the threshold temperature. Referring to FIGS. 1, 2, and 8, in addition to the states and state transitions based on error signal DESAT_N and error signal DESAT_P described above, additional states and state transitions are based on error signal OVERTEMP.

In normal state 502, if error signal OVERTEMP is active, then protection circuit 126 configures gate driver integrated circuit 100 in TOVER_LOW state 508. In DESAT_P state 504, if error signal OVERTEMP is active, then protection circuit 126 configures gate driver integrated circuit 100 in TOVER_TS state 512. In DESAT_N state 510, if error signal OVERTEMP is active, then protection circuit 126 configures gate driver integrated circuit 100 in TOVER_TS state 512.

In TOVER_LOW state 508, protection circuit 126 enables a timer and strongly drives the output low (e.g., having a strength that is equal to or greater than the strength used when driving the output low in normal state 502). Then, if error signal DESAT_N is active, then protection logic 126 configures gate driver integrated circuit 100 in DESAT_N state 510. If error signal DESAT_N is inactive and error signal OVERTEMP is inactive, then protection logic 126 configures gate driver integrated circuit 100 in DESAT_PRST state 506. Protection logic 126 configures gate driver integrated circuit 100 in TOVER_TS state 512 in response to the expiration of a predetermined interval (e.g., 1 ms) while in TOVER_LOW state 508.

In TOVER_TS state 512, protection circuit 126 resets the timer and weakly drives the output low (e.g., having a strength that is less than the strength used when driving the output low in normal state 502). Then, protection circuit 126 configures gate driver integrated circuit 100 to operate in state DESAT_N 510 in response to error signal OVERTEMP being reset. In DESAT_PRST state 506, protection circuit 126 resets the timer and then protection circuit 126 configures gate driver integrated circuit 100 in DESAT_P state 504. The safer states and conditions for transitioning between states described with reference to FIGS. 7 and 8 are exemplary only and in other embodiments of gate driver integrated circuit 100 other sensed information, associated error signals, states, or conditions for transitioning between a normal state and one or more safer state of gate driver integrated circuit 100 are used.

Thus, techniques for providing short circuit protection in a system including a gate driver integrated circuit are disclosed. The description of the invention set forth herein is illustrative and is not intended to limit the scope of the invention as set forth in the following claims. For example, while the invention has been described in an embodiment in which gate driver integrated circuit 100 is coupled to an IGBT high-power drive device, one of skill in the art will appreciate that the teachings herein can be utilized with other device types. In addition, while the invention has been described in embodiments in which gate driver integrated circuit 100 is used in a motor application, one of skill in the art will appreciate that the teachings herein can be utilized in other applications. Variations and modifications of the embodiments disclosed herein, may be made based on the description set forth herein, without departing from the scope of the invention as set forth in the following claims.

What is claimed is:

1. A method for protecting a system including a driver integrated circuit, the method comprising:
   receiving a driver input signal;
   logically combining a logic signal with the driver input signal to generate an indication of whether a rising edge of the driver input signal is delayed in an output signal at an output node of the driver integrated circuit coupled to a terminal of the driver integrated circuit, the logic signal being asserted in response to completion of a corresponding rising edge of the output signal;
   logically combining a second logic signal with the driver input signal to generate a second indication of whether a falling edge of the driver input signal is delayed in the output signal at the output node, the second logic signal being asserted in response to completion of a corresponding falling edge of the output signal;
   generating an error signal based on the indication and the second indication, ; and
   driving the output signal externally to the driver integrated circuit, the output signal being driven based on the driver input signal and the error signal.

2. The method as recited in claim 1 further comprising:
   generating the indication of the delay based on a counter value corresponding to the delay; and
   incrementing the counter value in response to a transition of the driver input signal in the absence of a corresponding transition of the output signal.

3. The method as recited in claim 1 further comprising:
   generating the indication of the delay based on a counter value corresponding to an estimate of a long-term average of the delay;
   incrementing the counter value by a first predetermined amount in response to a transition of the driver input signal in the absence of a corresponding transition of the output signal; and
   decrementing the counter value by a second predetermined amount in a predetermined interval.

4. The method as recited in claim 1 further comprising detecting an error condition based on the indication of the delay and a predetermined threshold and generating the error-signal based thereon.

5. The method as recited in claim 4 wherein the error signal indicates whether the error condition occurred in response to the output signal rising from a first voltage level to a second voltage level or in response to the output signal falling from the second voltage level to the first voltage level.

6. The method as recited in claim 1 wherein driving the output signal includes configuring an output driver to enter a safer output state for a predetermined interval in response to detecting an error condition based on the indication of the delay.

7. The method as recited in claim 6 wherein driving the output signal further includes transitioning from the safer output state to a normal state in response to expiration of the predetermined interval in the safer output state.

8. The method as recited in claim 6 wherein the output driver is configured to transition to the safer output state from a second safer output state and in response to a second expiration of a second predetermined interval in the second safer output state, and driving the output signal further comprises transitioning to the second safer output state from a normal output state.

9. The method as recited in claim 6 wherein in the safer output state, an output device of the output driver is configured in a strong pull-down configuration or a weak pull-down configuration, the output driver being configured in the weak pull-down configuration from the strong pull-down configuration after a predetermined period of time.

10. The method as recited in claim 1 wherein the output signal is driven further based on a second indication of a sensed temperature of the driver integrated circuit, and the method further comprises:
    generating the second indication based on the sensed temperature of a die of the driver integrated circuit; and
    configuring an output driver to enter a safer output state in response to the second indication exceeding a predetermined threshold.

11. The method as recited in claim 1 further comprising:
    asserting the logic signal in response to completion of the rising edge of an output signal at the output node of the driver integrated circuit coupled to the terminal of the driver integrated circuit, the logic signal being deasserted otherwise; and
    asserting the second logic signal in response to completion of the falling edge of the output signal, the second logic signal being deasserted otherwise.

12. An integrated circuit for controlling a high-power drive device, the integrated circuit comprising:
    a driver circuit configured to drive an output signal to a terminal of the integrated circuit, the output signal being driven based on a driver input signal and an error signal; and
    a logic circuit configured to generate the error signal based on a first logical combination of a logic signal and the driver input signal indicating whether a rising edge of the driver input signal is delayed in the output signal and a second logical combination of a second logic signal and the driver input signal indicating whether a falling edge of the driver input signal is delayed in the output signal, the logic signal being asserted in response to completion of a corresponding rising edge of the output signal, and the second logic signal being asserted in response to completion of a corresponding falling edge of the output signal.

13. The integrated circuit as recited in claim 12 wherein the logic circuit comprises a counter circuit configured to increment a counter value corresponding to the delay in response to a transition of the driver input signal in the absence of a corresponding transition of the output signal, the indication of the delay being based on the counter value.

14. The integrated circuit as recited in claim 12 wherein the logic circuit is further configured to detect an error condition based on the indication of the delay and a predetermined threshold, and further configured to indicate whether the error condition occurred in response to the output signal rising from a first voltage level to a second voltage level or in response to the output signal falling from the second voltage level to the first voltage level.

15. The integrated circuit as recited in claim 12 wherein the logic circuit is configured to cause an output driver to enter a safer output state for a predetermined interval in response to detecting an error condition based on the indication of the delay.

16. The integrated circuit as recited in claim 15 wherein the logic circuit is further configured to transition the output driver from the safer output state to a normal state in response to expiration of the predetermined interval in the safer output state and no other error condition being detected.

17. The integrated circuit as recited in claim 15 wherein the logic circuit is further configured to transition the output driver to the safer output state from a second safer output state and in response to a second expiration of a second predetermined interval in the second safer output state, and driving the output signal further comprises transitioning to the second safer output state from a normal output state.

18. The integrated circuit as recited in claim 15 wherein in the safer output state, an output device of the output driver is configured in a strong pull-down configuration or a weak pull-down configuration, the output driver being configured in the weak pull-down configuration from the strong pull-down configuration after a predetermined period of time.

19. The integrated circuit as recited in claim 12 further comprising a temperature sensor configured to sense a temperature of the integrated circuit, the output signal being driven further based on a second indication, and the logic circuit being configured to generate the second indication based on a sensed temperature of the integrated circuit and to cause an output driver to enter a safer output state in response to the second indication exceeding a predetermined threshold.

20. An integrated circuit for controlling a high-power drive device, the integrated circuit comprising:

a driver circuit configured to drive an output signal to a terminal of the integrated circuit, the output signal being driven based on a driver input signal and an error signal; and a logic circuit configured to generate the error signal based on an indication of a delay between receipt of an edge of the driver input signal and arrival of a corresponding edge of the output signal at an output node of the integrated circuit coupled to the terminal, the logic circuit comprising a counter circuit configured to add a first predetermined value to a counter value corresponding to an estimate of a long-term average of the delay in response a transition of the driver input signal in the absence of a corresponding transition of the output signal, and configured to subtract a second predetermined value from the count value in a predetermined interval, the indication of the delay being based on the counter value.

21. The integrated circuit as recited in claim 20 wherein the logic circuit is configured to cause an output driver to enter a safer output state for a predetermined interval in response to detecting an error condition based on the indication of the delay, in the safer output state, an output device of the output driver is configured in a strong pull-down configuration or a weak pull-down configuration, the output driver being configured in the weak pull-down configuration from the strong pull-down configuration after a predetermined period of time.

* * * * *